US006846704B2

(12) United States Patent
Paek

(10) Patent No.: US 6,846,704 B2
(45) Date of Patent: Jan. 25, 2005

(54) SEMICONDUCTOR PACKAGE AND METHOD FOR MANUFACTURING THE SAME

(75) Inventor: Jong Sik Paek, Kwangju-shi (KR)

(73) Assignee: Amkor Technology, Inc., Chandler, AZ (US)

(*) Notice: Subject to any disclaimer, the term of this patent is extended or adjusted under 35 U.S.C. 154(b) by 28 days.

(21) Appl. No.: 10/680,280

(22) Filed: Oct. 7, 2003

(65) Prior Publication Data

US 2004/0065905 A1 Apr. 8, 2004

Related U.S. Application Data

(62) Division of application No. 10/103,048, filed on Mar. 21, 2002, now Pat. No. 6,700,187.

(30) Foreign Application Priority Data

Mar. 27, 2001 (KR) ........................................ 2001-15991

(51) Int. Cl.[7] ......................... H01L 21/44; H01L 21/48; H01L 21/50

(52) U.S. Cl. ........................ 438/123; 438/106; 438/127

(58) Field of Search ............................ 438/123, 25, 26, 438/51, 55, 64, 106, 111, 112, 122, 124, 126, 127

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |
| 4,417,266 | A | 11/1983 | Grabbe |
| 4,451,224 | A | 5/1984 | Harding |
| 4,530,152 | A | 7/1985 | Roche et al. |
| 4,541,003 | A | 9/1985 | Otsuka et al. |
| 4,646,710 | A | 3/1987 | Schmid et al. |
| 4,707,724 | A | 11/1987 | Suzuki et al. |
| 4,727,633 | A | 3/1988 | Herrick |

(List continued on next page.)

FOREIGN PATENT DOCUMENTS

| | | |
|---|---|---|
| DE | 19734794 A1 | 8/1997 |
| EP | 5421117 | 6/1979 |
| EP | 5950939 | 3/1984 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |

(List continued on next page.)

*Primary Examiner*—David Nhu
(74) *Attorney, Agent, or Firm*—Stetina Brunda Garred & Brucker

(57) ABSTRACT

A semiconductor package is provided which includes a semiconductor die having opposed, generally planar first and second surfaces and a peripheral edge. Formed on the second surface of the semiconductor die in close proximity to the peripheral edge thereof is a plurality of bond pads. The semiconductor package further includes a plurality of leads which are positioned about the peripheral edge of the semiconductor die in space relation to the second surface thereof. Each of the leads includes opposed, generally planar first and second surfaces, and a generally planar third surface which is oriented between the first and second surfaces in opposed relation to a portion of the second surface. In the semiconductor package, a plurality of conductive bumps are used to electrically and mechanically connect the bond pads of the semiconductor die to the third surfaces of the respective ones of the leads. An encapsulating portion is applied to and partially encapsulates the leads, the semiconductor die, and the conductive bumps.

20 Claims, 7 Drawing Sheets

U.S. PATENT DOCUMENTS

| | | | |
|---|---|---|---|
| 4,737,839 | A | 4/1988 | Burt |
| 4,756,080 | A | 7/1988 | Thorp, Jr. et al. |
| 4,812,896 | A | 3/1989 | Rothgery et al. |
| 4,862,245 | A | 8/1989 | Pashby et al. |
| 4,862,246 | A | 8/1989 | Masuda et al. |
| 4,907,067 | A | 3/1990 | Derryberry |
| 4,920,074 | A | 4/1990 | Shimizu et al. |
| 4,935,803 | A | 6/1990 | Kalfus et al. |
| 4,942,454 | A | 7/1990 | Mori et al. |
| 4,987,475 | A | 1/1991 | Schlesinger et al. |
| 5,018,003 | A | 5/1991 | Yasunaga et al. |
| 5,029,386 | A | 7/1991 | Chao et al. |
| 5,041,902 | A | 8/1991 | McShane |
| 5,057,900 | A | 10/1991 | Yamazaki |
| 5,059,379 | A | 10/1991 | Tsutsumi et al. |
| 5,065,223 | A | 11/1991 | Matsuki et al. |
| 5,070,039 | A | 12/1991 | Johnson et al. |
| 5,087,961 | A | 2/1992 | Long et al. |
| 5,091,341 | A | 2/1992 | Asada et al. |
| 5,096,852 | A | 3/1992 | Hobson |
| 5,118,298 | A | 6/1992 | Murphy |
| 5,151,039 | A | 9/1992 | Murphy |
| 5,157,475 | A | 10/1992 | Yamaguchi |
| 5,157,480 | A | 10/1992 | McShane et al. |
| 5,168,368 | A | 12/1992 | Gow, 3rd et al. |
| 5,172,213 | A | 12/1992 | Zimmerman |
| 5,172,214 | A | 12/1992 | Casto |
| 5,175,060 | A | 12/1992 | Enomoto et al. |
| 5,200,362 | A | 4/1993 | Lin et al. |
| 5,200,809 | A | 4/1993 | Kwon |
| 5,214,845 | A | 6/1993 | King et al. |
| 5,216,278 | A | 6/1993 | Lin et al. |
| 5,218,231 | A | 6/1993 | Kudo |
| 5,221,642 | A | 6/1993 | Burns |
| 5,250,841 | A | 10/1993 | Sloan et al. |
| 5,252,853 | A | 10/1993 | Michii |
| 5,258,094 | A | 11/1993 | Furui et al. |
| 5,266,834 | A | 11/1993 | Nishi et al. |
| 5,273,938 | A | 12/1993 | Lin et al. |
| 5,277,972 | A | 1/1994 | Sakumoto et al. |
| 5,278,446 | A | 1/1994 | Nagaraj et al. |
| 5,279,029 | A | 1/1994 | Burns |
| 5,281,849 | A | 1/1994 | Singh Deo et al. |
| 5,294,897 | A | 3/1994 | Notani et al. |
| 5,327,008 | A | 7/1994 | Djennas et al. |
| 5,332,864 | A | 7/1994 | Liang et al. |
| 5,335,771 | A | 8/1994 | Murphy |
| 5,336,931 | A | 8/1994 | Juskey et al. |
| 5,343,076 | A | 8/1994 | Katayama et al. |
| 5,358,905 | A | 10/1994 | Chiu |
| 5,365,106 | A | 11/1994 | Watanabe |
| 5,381,042 | A | 1/1995 | Lerner et al. |
| 5,391,439 | A | 2/1995 | Tomita et al. |
| 5,406,124 | A | 4/1995 | Morita et al. |
| 5,410,180 | A | 4/1995 | Fujii et al. |
| 5,414,299 | A | 5/1995 | Wang et al. |
| 5,424,576 | A | 6/1995 | Djennas et al. |
| 5,428,248 | A | 6/1995 | Cha |
| 5,435,057 | A | 7/1995 | Bindra et al. |
| 5,444,301 | A | 8/1995 | Song et al. |
| 5,452,511 | A | 9/1995 | Chang |
| 5,454,905 | A | 10/1995 | Fogelson |
| 5,474,958 | A | 12/1995 | Djennas et al. |
| 5,484,274 | A | 1/1996 | Neu |
| 5,493,151 | A | 2/1996 | Asada et al. |
| 5,508,556 | A | 4/1996 | Lin |
| 5,517,056 | A | 5/1996 | Bigler et al. |
| 5,521,429 | A | 5/1996 | Aono et al. |
| 5,528,076 | A | 6/1996 | Pavio |
| 5,534,467 | A | 7/1996 | Rostoker |
| 5,539,251 | A | 7/1996 | Iverson et al. |
| 5,543,657 | A | 8/1996 | Diffenderfer et al. |
| 5,544,412 | A | 8/1996 | Romero et al. |
| 5,545,923 | A | 8/1996 | Barber |
| 5,581,122 | A | 12/1996 | Chao et al. |
| 5,592,019 | A | 1/1997 | Ueda et al. |
| 5,592,025 | A | 1/1997 | Clark et al. |
| 5,594,274 | A | 1/1997 | Suetaki |
| 5,595,934 | A | 1/1997 | Kim |
| 5,604,376 | A | 2/1997 | Hamburgen et al. |
| 5,608,267 | A | 3/1997 | Mahulikar et al. |
| 5,625,222 | A | 4/1997 | Yoneda et al. |
| 5,633,528 | A | 5/1997 | Abbott et al. |
| 5,639,990 | A | 6/1997 | Nishihara et al. |
| 5,640,047 | A | 6/1997 | Nakashima |
| 5,641,997 | A | 6/1997 | Ohta et al. |
| 5,643,433 | A | 7/1997 | Fukase et al. |
| 5,644,169 | A | 7/1997 | Chun |
| 5,646,831 | A | 7/1997 | Manteghi |
| 5,650,663 | A | 7/1997 | Parthasarathi |
| 5,661,088 | A | 8/1997 | Tessier et al. |
| 5,665,996 | A | 9/1997 | Williams et al. |
| 5,673,479 | A | 10/1997 | Hawthorne |
| 5,683,806 | A | 11/1997 | Sakumoto et al. |
| 5,689,135 | A | 11/1997 | Ball |
| 5,696,666 | A | 12/1997 | Miles et al. |
| 5,701,034 | A | 12/1997 | Marrs |
| 5,703,407 | A | 12/1997 | Hori |
| 5,710,064 | A | 1/1998 | Song et al. |
| 5,723,899 | A | 3/1998 | Shin |
| 5,724,233 | A | 3/1998 | Honda et al. |
| 5,736,432 | A | 4/1998 | Mackessy |
| 5,745,984 | A | 5/1998 | Cole, Jr. et al. |
| 5,753,532 | A | 5/1998 | Sim |
| 5,753,977 | A | 5/1998 | Kusaka et al. |
| 5,766,972 | A | 6/1998 | Takahashi et al. |
| 5,770,888 | A | 6/1998 | Song et al. |
| 5,776,798 | A | 7/1998 | Quan et al. |
| 5,783,861 | A | 7/1998 | Son |
| 5,801,440 | A | 9/1998 | Chu et al. |
| 5,814,877 | A | 9/1998 | Diffenderfer et al. |
| 5,814,881 | A | 9/1998 | Alagaratnam et al. |
| 5,814,883 | A | 9/1998 | Sawai et al. |
| 5,814,884 | A | 9/1998 | Davis et al. |
| 5,817,540 | A | 10/1998 | Wark |
| 5,818,105 | A | 10/1998 | Kouda |
| 5,821,457 | A | 10/1998 | Mosley et al. |
| 5,821,615 | A | 10/1998 | Lee |
| 5,834,830 | A | 11/1998 | Cho |
| 5,835,988 | A | 11/1998 | Ishii |
| 5,844,306 | A | 12/1998 | Fujita et al. |
| 5,856,911 | A | 1/1999 | Riley |
| 5,859,471 | A | 1/1999 | Kuraishi et al. |
| 5,866,939 | A | 2/1999 | Shin et al. |
| 5,871,782 | A | 2/1999 | Choi |
| 5,874,784 | A | 2/1999 | Aoki et al. |
| 5,877,043 | A | 3/1999 | Alcoe et al. |
| 5,886,397 | A | 3/1999 | Ewer |
| 5,886,398 | A | 3/1999 | Low et al. |
| 5,894,108 | A | 4/1999 | Mostafazadeh et al. |
| 5,897,339 | A | 4/1999 | Song et al. |
| 5,900,676 | A | 5/1999 | Kweon et al. |
| 5,903,049 | A | 5/1999 | Mori |
| 5,903,050 | A | 5/1999 | Thurairajaratnam et al. |
| 5,909,053 | A | 6/1999 | Fukase et al. |
| 5,915,998 | A | 6/1999 | Stidham et al. |
| 5,917,242 | A | 6/1999 | Ball |
| 5,939,779 | A | 8/1999 | Kim |
| 5,942,794 | A | 8/1999 | Okumura et al. |
| 5,951,305 | A | 9/1999 | Haba |
| 5,959,356 | A | 9/1999 | Oh |

| | | | | |
|---|---|---|---|---|
| 5,969,426 | A | | 10/1999 | Baba et al. |
| 5,973,388 | A | | 10/1999 | Chew et al. |
| 5,976,912 | A | | 11/1999 | Fukutomi et al. |
| 5,977,613 | A | | 11/1999 | Takata et al. |
| 5,977,615 | A | | 11/1999 | Yamaguchi et al. |
| 5,977,630 | A | | 11/1999 | Woodworth et al. |
| 5,981,314 | A | | 11/1999 | Glenn et al. |
| 5,986,333 | A | | 11/1999 | Nakamura |
| 5,986,885 | A | | 11/1999 | Wyland |
| 6,001,671 | A | | 12/1999 | Fjelstad |
| 6,013,947 | A | | 1/2000 | Lim |
| 6,018,189 | A | | 1/2000 | Mizuno |
| 6,020,625 | A | | 2/2000 | Qin et al. |
| 6,025,640 | A | | 2/2000 | Yagi et al. |
| 6,031,279 | A | | 2/2000 | Lenz |
| RE36,613 | E | | 3/2000 | Ball |
| 6,034,423 | A | | 3/2000 | Mostafazadeh |
| 6,040,626 | A | | 3/2000 | Cheah et al. |
| 6,043,430 | A | | 3/2000 | Chun |
| 6,060,768 | A | | 5/2000 | Hayashida et al. |
| 6,060,769 | A | | 5/2000 | Wark |
| 6,072,228 | A | | 6/2000 | Hinkle et al. |
| 6,075,284 | A | | 6/2000 | Choi et al. |
| 6,081,029 | A | | 6/2000 | Yamaguchi |
| 6,084,310 | A | | 7/2000 | Mizuno et al. |
| 6,087,715 | A | | 7/2000 | Sawada et al. |
| 6,087,722 | A | | 7/2000 | Lee et al. |
| 6,100,594 | A | | 8/2000 | Fukui et al. |
| 6,113,473 | A | | 9/2000 | Costantini et al. |
| 6,118,174 | A | | 9/2000 | Kim |
| 6,118,184 | A | | 9/2000 | Ishio et al. |
| RE36,907 | E | | 10/2000 | Templeton, Jr. et al. |
| 6,130,115 | A | | 10/2000 | Okumura et al. |
| 6,130,473 | A | | 10/2000 | Mostafazadeh et al. |
| 6,133,623 | A | | 10/2000 | Otsuki et al. |
| 6,140,154 | A | | 10/2000 | Hinkle et al. |
| 6,143,981 | A | | 11/2000 | Glenn |
| 6,169,329 | B1 | | 1/2001 | Farnworth et al. |
| 6,177,718 | B1 | | 1/2001 | Kozono |
| 6,181,002 | B1 | | 1/2001 | Juso et al. |
| 6,184,465 | B1 | | 2/2001 | Corisis |
| 6,184,573 | B1 | | 2/2001 | Pu |
| 6,194,777 | B1 | | 2/2001 | Abbott et al. |
| 6,197,615 | B1 | | 3/2001 | Song et al. |
| 6,198,171 | B1 | | 3/2001 | Huang et al. |
| 6,201,186 | B1 | | 3/2001 | Daniels et al. |
| 6,201,292 | B1 | | 3/2001 | Yagi et al. |
| 6,204,554 | B1 | | 3/2001 | Ewer et al. |
| 6,208,020 | B1 | | 3/2001 | Minamio |
| 6,208,021 | B1 | * | 3/2001 | Ohuchi et al. .............. 257/690 |
| 6,208,023 | B1 | | 3/2001 | Nakayama et al. |
| 6,211,462 | B1 | | 4/2001 | Carter, Jr. et al. |
| 6,218,731 | B1 | | 4/2001 | Huang et al. |
| 6,222,258 | B1 | | 4/2001 | Asano et al. |
| 6,225,146 | B1 | | 5/2001 | Yamaguchi et al. |
| 6,229,200 | B1 | | 5/2001 | McLellan et al. |
| 6,229,205 | B1 | | 5/2001 | Jeong et al. |
| 6,239,367 | B1 | | 5/2001 | Hsuan et al. |
| 6,239,384 | B1 | | 5/2001 | Smith et al. |
| 6,242,281 | B1 | | 6/2001 | McLellan et al. |
| 6,256,200 | B1 | | 7/2001 | Lam et al. |
| 6,258,629 | B1 | | 7/2001 | Niones et al. |
| 6,281,566 | B1 | | 8/2001 | Magni |
| 6,281,568 | B1 | | 8/2001 | Glenn et al. |
| 6,282,095 | B1 | | 8/2001 | Houghton et al. |
| 6,285,075 | B1 | | 9/2001 | Combs et al. |
| 6,291,271 | B1 | | 9/2001 | Lee et al. |
| 6,291,273 | B1 | | 9/2001 | Miyaki et al. |
| 6,294,100 | B1 | | 9/2001 | Fan et al. |
| 6,294,830 | B1 | | 9/2001 | Fjelstad |
| 6,295,977 | B1 | | 10/2001 | Ripper et al. |
| 6,297,548 | B1 | | 10/2001 | Moden et al. |
| 6,303,984 | B1 | | 10/2001 | Corisis |
| 6,303,997 | B1 | * | 10/2001 | Lee ............................ 257/778 |
| 6,307,272 | B1 | | 10/2001 | Takahashi et al. |
| 6,309,909 | B1 | | 10/2001 | Ohgiyama |
| 6,316,822 | B1 | | 11/2001 | Venkateshwaran et al. |
| 6,316,838 | B1 | | 11/2001 | Ozawa et al. |
| 6,323,550 | B1 | | 11/2001 | Martin et al. |
| 6,326,243 | B1 | | 12/2001 | Suzuya et al. |
| 6,326,244 | B1 | | 12/2001 | Brooks et al. |
| 6,326,678 | B1 | | 12/2001 | Kamezos et al. |
| 6,335,564 | B1 | | 1/2002 | Pour |
| 6,337,510 | B1 | | 1/2002 | Chun-Jen et al. |
| 6,339,255 | B1 | | 1/2002 | Shin |
| 6,348,726 | B1 | | 2/2002 | Bayan et al. |
| 6,355,502 | B1 | | 3/2002 | Kang et al. |
| 6,369,447 | B2 | | 4/2002 | Mori |
| 6,369,454 | B1 | | 4/2002 | Chung |
| 6,373,127 | B1 | | 4/2002 | Baudouin et al. |
| 6,380,048 | B1 | | 4/2002 | Boon et al. |
| 6,384,472 | B1 | | 5/2002 | Huang |
| 6,388,336 | B1 | | 5/2002 | Venkateshwaran et al. |
| 6,395,578 | B1 | | 5/2002 | Shin et al. |
| 6,400,004 | B1 | | 6/2002 | Fan et al. |
| 6,410,979 | B2 | | 6/2002 | Abe |
| 6,414,385 | B1 | | 7/2002 | Huang et al. |
| 6,420,779 | B1 | | 7/2002 | Sharma et al. |
| 6,429,508 | B1 | | 8/2002 | Gang |
| 6,437,429 | B1 | | 8/2002 | Su et al. |
| 6,444,499 | B1 | | 9/2002 | Swiss et al. |
| 6,448,633 | B1 | | 9/2002 | Yee et al. |
| 6,452,279 | B2 | | 9/2002 | Shimoda |
| 6,464,121 | B2 | | 10/2002 | Reijnders |
| 6,476,469 | B2 | | 11/2002 | Hung et al. |
| 6,476,474 | B1 | | 11/2002 | Hung |
| 6,482,680 | B1 | * | 11/2002 | Khor et al. ................. 438/121 |
| 6,498,099 | B1 | | 12/2002 | McLellan et al. |
| 6,498,392 | B2 | | 12/2002 | Azuma |
| 6,507,096 | B2 | | 1/2003 | Gang |
| 6,507,120 | B2 | * | 1/2003 | Lo et al. ..................... 257/778 |
| 6,534,849 | B1 | | 3/2003 | Gang |
| 6,545,345 | B1 | | 4/2003 | Glenn et al. |
| 6,559,525 | B2 | | 5/2003 | Huang |
| 6,566,168 | B2 | | 5/2003 | Gang |
| 2001/0008305 | A1 | | 7/2001 | McLellan et al. |
| 2001/0011654 | A1 | | 8/2001 | Kimura |
| 2001/0014538 | A1 | | 8/2001 | Kwan et al. |
| 2002/0024122 | A1 | | 2/2002 | Jung et al. |
| 2002/0027297 | A1 | | 3/2002 | Ikenaga et al. |
| 2002/0140061 | A1 | | 10/2002 | Lee |
| 2002/0140068 | A1 | | 10/2002 | Lee et al. |
| 2002/0163015 | A1 | | 11/2002 | Lee et al. |
| 2003/0030131 | A1 | | 2/2003 | Lee et al. |
| 2003/0073265 | A1 | | 4/2003 | Hu et al. |

FOREIGN PATENT DOCUMENTS

| | | |
|---|---|---|
| EP | 0844665 | 5/1998 |
| EP | 0936671 | 8/1999 |
| EP | 098968 | 3/2000 |
| EP | 1032037 | 8/2000 |
| JP | 55163868 | 12/1980 |
| JP | 5745959 | 3/1982 |
| JP | 58160095 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |

| | | |
|---|---|---|
| JP | 63067762 | 3/1988 |
| JP | 63205935 | 8/1988 |
| JP | 63233555 | 9/1988 |
| JP | 63249345 | 10/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 3177060 | 8/1991 |
| JP | 4098864 | 9/1992 |
| JP | 5129473 | 5/1993 |
| JP | 5166992 | 7/1993 |
| JP | 5283460 | 10/1993 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 864634 | 3/1996 |
| JP | 8083877 | 3/1996 |
| JP | 8125066 | 5/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9293822 | 11/1997 |
| JP | 10022447 | 1/1998 |
| JP | 10163401 | 6/1998 |
| JP | 10199934 | 7/1998 |
| JP | 10256240 | 9/1998 |
| JP | 00150765 | 5/2000 |
| JP | 556398 | 10/2000 |
| JP | 2001060648 | 3/2001 |
| JP | 200204397 | 8/2002 |
| KR | 941979 | 1/1994 |
| KR | 9772358 | 11/1997 |
| KR | 100220154 | 6/1999 |
| KR | 0049944 | 6/2002 |
| WO | 9956316 | 11/1999 |
| WO | 9967821 | 12/1999 |

* cited by examiner

SEMICONDUCTOR PACKAGE AND METHOD FOR MANUFACTURING THE SAME

CROSS-REFERENCE TO RELATED APPLICATIONS

The present application is a divisional of U.S. application Ser. No. 10/103,048 entitled SEMICONDUCTOR PACKAGE AND METHOD FOR MANUFACTURING THE SAME filed Mar. 21, 2002, now U.S. Pat. No. 6,700,187, which claims priority to Korean Patent Application No. 2001-15991 entitled SEMICONDUCTOR PACKAGE AND METHOD FOR MANUFACTURING THE SAME filed Mar. 27, 2001.

STATEMENT RE: FEDERALLY SPONSORED RESEARCH/DEVELOPMENT (Not Applicable)

BACKGROUND OF THE INVENTION

1. Field of the Invention

The present invention relates generally to semiconductor packages, and more particularly to a semiconductor package which is specifically configured to maximize the dissipation or discharge of heat generated from the semiconductor die thereof.

2. Description of the Related Art

A recent trend in the electronics industry has been to develop semiconductor package structures which maximize the dissipation or discharging effect of heat generated from the semiconductor die of the package. However, semiconductor packages having superior heat dissipation capabilities are often of a size which decreases or diminishes their utility in certain applications. The present invention is specifically adapted to address this deficiency by providing a semiconductor package having superior heat dissipation capabilities and simple, light, thin and miniature structural characteristics, thus allowing the same to be reduced to a "chip size" in order for easy mounting to electronic appliances such as communication equipment. Coupled with the improved heat dissipation efficiency of the present semiconductor package are the benefits of reduced manufacturing costs attributable to its simplified design.

BRIEF SUMMARY OF THE INVENTION

In accordance with the present invention, there is provided various embodiments of a heat dissipating semiconductor package and related methods for manufacturing the same. In each embodiment of the present invention, the semiconductor package includes a semiconductor die which is mechanically and electrically connected to a plurality of leads through the use of conductive bumps. More particularly, the conductive bumps extend to surfaces of the leads which are formed by a partial etching technique. The orientation of the leads relative to the semiconductor die, coupled with the use of the conductive bumps to mechanically and electrically connect the semiconductor die and leads to each other, facilitates a significant reduction in the overall thickness of the semiconductor package, resulting in a light, thin, and simple structure.

Additionally, in each embodiment of the semiconductor package of the present invention, prescribed regions or surfaces of the leads are exposed within the encapsulating portion of the semiconductor package. The encapsulating portion fully encapsulates the conductive bumps, and may fully or partially encapsulate the semiconductor die. In this regard, in certain embodiments of the present invention, a prescribed region or surface of the semiconductor die is also exposed within the encapsulating portion. The exposed surfaces of the leads alone or in combination with the exposed surface of the semiconductor die maximizes the heat discharging efficiency of the semiconductor package. In one additional embodiment of the semiconductor package a die paddle is included, with one surface of the semiconductor die being bonded to the die paddle. One surface of the die paddle may also be exposed within the encapsulating portion of the semiconductor package, thus further increasing the heat discharging efficiency thereof.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
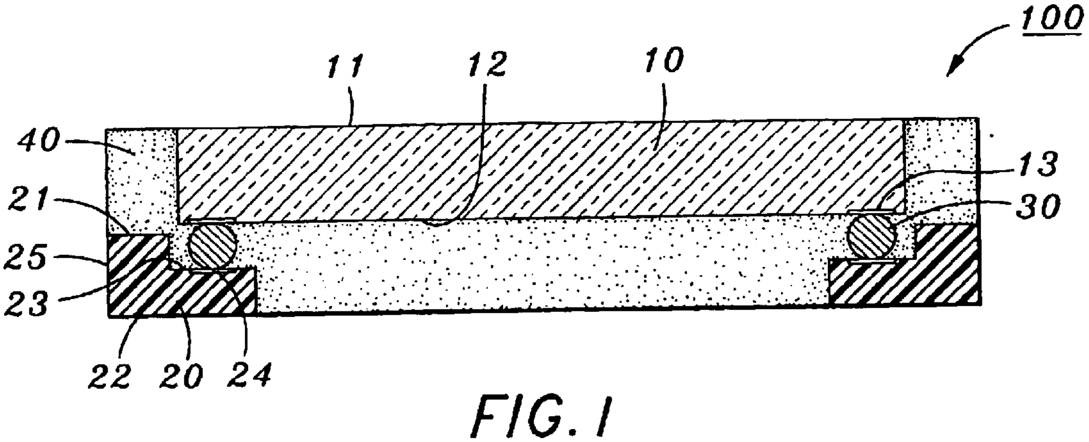
FIG. 1 is a cross-sectional view of a semiconductor package constructed in accordance with a first embodiment of the present invention.

Referring now to the drawings wherein the showings are for purposes of illustrating preferred embodiments of the present invention only, and not for purposes of limiting the same, FIG. 1 illustrates in cross section a semiconductor package 100 constructed in accordance with a first embodiment of the present invention. The semiconductor package 100 includes a semiconductor die 10 which defines a generally planar first surface 11 and a generally planar second surface 12 which is disposed in opposed relation to the first surface 11. Located on the second surface 12 of the semiconductor die 10 adjacent the peripheral edge thereof are a plurality of bond pads 13 which are used for routing electrical signals to and from the semiconductor die 10.

In addition to the semiconductor die 10, the semiconductor package 100 includes a plurality of leads 20 which are disposed about the periphery of the second surface 12 of the semiconductor die 10 in spaced relation thereto. Each of the leads 20 defines a generally planar first surface 21 and a generally planar second surface 22 which is disposed in opposed relation to the first surface 21. The second surface 22 of each of the leads 20 is longer than the first surface 21 thereof. As such, a portion of the second surface 22 of each lead 20 extends inwardly relative to the corresponding peripheral edge of the second surface 12 of the semiconductor die 10.

In addition to the first and second surfaces 21, 22, each of the leads 20 includes a generally planar third surface 23 which is formed between the first and second surfaces 21, 22, i.e., is perpendicularly offset relative to the first surface 21. In this regard, the thickness of each lead 20 between the second and third surfaces 22, 23 thereof is approximately one-half the thickness between the first and second surfaces 21, 22. Each lead 20 is oriented relative to the semiconductor die 10 such that the third surface 23 overlaps the second surface 12 of the semiconductor die 10, i.e., extends inwardly relative to the corresponding peripheral edge of the second surface 12. As such, that portion of each second surface 22 extending inwardly relative to the corresponding peripheral edge of the second surface 12 as described above is disposed in opposed relation to the third surface 23. Each of the leads 20 further includes a side surface 25 which is formed and extends between the first and second surfaces 21, 22 thereof. The leads 20 are each fabricated from a metallic material such as copper, aluminum, or titanium.

In the semiconductor package 100, the semiconductor die 10 and the leads 20 are electrically and mechanically connected to each other via conductive bumps 30. The conductive bumps 30 are formed between the bond pads 13 of the semiconductor die 10 and the third surfaces 23 of respective ones of the leads 20. In the event that the leads 20 are fabricated from a material such as aluminum or titanium, it is contemplated that a conductive layer 24 can be pre-formed on the third surface 23 of each of the leads 20 in order for the conductive bumps 30 to be more easily adhered or connected thereto. The conductive layer 24 may be fabricated from a material such as copper. During a reflow process used to electrically and mechanically connect the semiconductor die 10 to the leads 20 as is discussed in more detail below, each conductive bump 30 is easily adhered to a respective copper conductive layer 24, yet is prevented from spreading out or excessively overflowing along the third surface of the corresponding lead 20 due to the aluminum or titanium construction thereof. The conductive layer 24 may be formed on the corresponding third surface 23 through the use of an electroplating technique or an electroless plating technique. The conductive bumps 30 may each be fabricated from gold, a conventional solder, or like materials. Those of ordinary skill in the art will recognize that the present invention is not limited by the material of the conductive bumps 30. The electrical connection of the semiconductor die to the recessed third surfaces 23 of the leads 20 through the use of the conductive bumps 30 considerably reduces the entire thickness of the semiconductor package 100.

Figure 4:
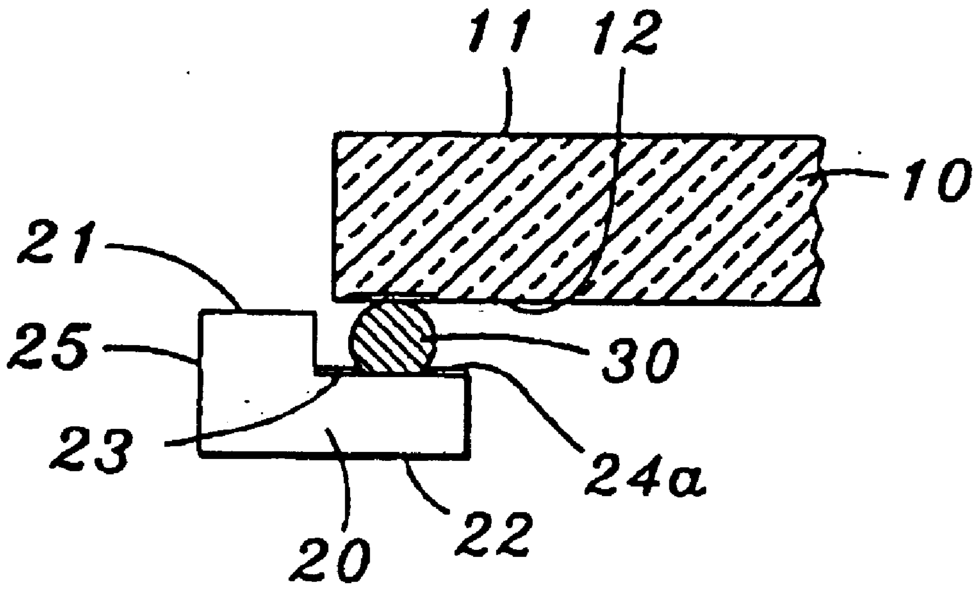
FIG. 4 is a cross-sectional view of a lead of the semiconductor package constructed in accordance with either the first, second, or third embodiments of the present invention including an optional protective layer thereon.

Referring now to FIG. 4, as an alternative to the conductive layer 24, each of the leads 20 may be provided with a protective layer 24*a* on the third surface 23 thereof. It is contemplated that the protective layer 24*a* will be employed when each of the leads 20 is fabricated from a copper material, as opposed to an aluminum or titanium material. The protective layer 24*a* is formed on the third surface 23 so as to circumvent a portion thereof, with such circumvented portion of the third surface 23 defining a bump land for a respective one of the conductive bumps 30. The protective layer 24*a* may be fabricated from a conductive material or a nonconductive material, with suitable materials including aluminum, titanium, polyimide, and BCB (Benzo Cyclo Butene). During the reflow process used to electrically and mechanically connect the semiconductor die 10 to the leads 20, the protective layer 24*a* serves to prevent the conductive bumps 30 from excessively overflowing along the third surface 23 of each lead 20, i.e., the conductive bump 30 is maintained within the bump land defined by that portion of the third surface 23 circumvented by the protective layer 24*a*. The protective layer 24*a* may also be formed through the use of an electroplating technique or an electroless plating technique.

As further seen in FIG. 1, in the semiconductor package 100, the semiconductor die 10, the conductive bumps 30, and the leads 20 are partially encapsulated by an encapsulant such as an epoxy molding compound for purposes of protecting the same from the external environment. The hardening or curing of the encapsulant forms an encapsulating portion 40. In the semiconductor package 100, the first surface 11 of the semiconductor die 10 is exposed to the outside of the encapsulating portion 40 (i.e., is exposed within the top surface thereof) thus improving the heat discharging efficiency of the semiconductor package 100. Also exposed to the outside of the encapsulating portion 40 are the second surfaces 22 of the leads 20. The second surfaces 22 are exposed within the bottom surface of the encapsulating portion 40 for purposes of allowing the semiconductor package to be easily mounted to an external device. Further, the side surface 25 of each of the leads 20 is exposed within the side surface of the encapsulating portion 40, thus further improving the heat discharging efficiency of the semiconductor package 100. It is contemplated that in the semiconductor package 100, the first surface 11 of the semiconductor die 10 will be substantially flush with the top surface of the encapsulating portion 40, the second surfaces 22 of the leads 20 will be substantially flush with the bottom surface of the encapsulating portion 40, and the side surfaces 25 of the leads 20 will be substantially flush with the side surface of the encapsulating portion 40 so as to minimize the thickness and width of the semiconductor package 100.

Figure 1A:
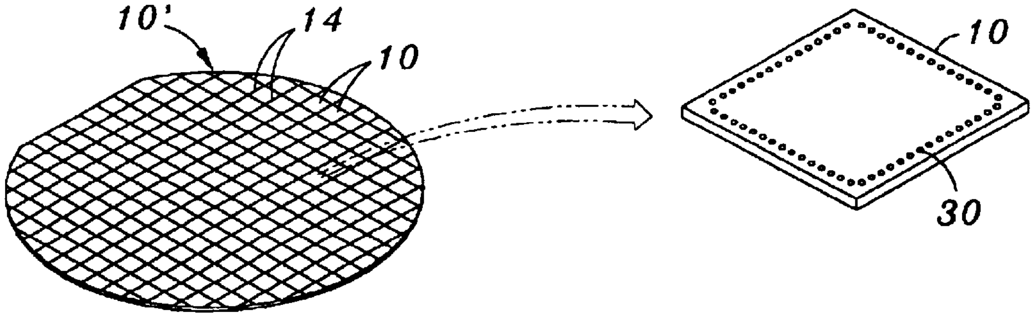
FIGS. 1A–1D are views illustrating a sequence of steps which may be employed for manufacturing the semiconductor package of the first embodiment shown in FIG. 1.

Having thus described the structural attributes of the semiconductor package 100 of the first embodiment, a preferred method of manufacturing the same will now be discussed with reference to FIGS. 1A–1D. As shown in FIG. 1A, a wafer 10' having a plurality of semiconductor dies 10 connected to each other with boundaries of scribing lines 14 is provided in an initial step of the present method. The sawing of the wafer 10' by, for example, a diamond blade along the scribing lines 14 thereby separates the semiconductor dies 10 from the wafer 10' as individual pieces or components. Each semiconductor die 10 produced as a result of sawing the wafer 10' in the above-described manner has the above-described structural attributes. It is contemplated that the conductive bumps 30 may be fused to the bond pads 13 of each of the semiconductor dies 10 of the wafer 10' in advance (i.e., prior to cutting the wafer 10' along the scribing lines 14), or may alternatively be fused to the bond pads 13 of each of the separated semiconductor dies 10 subsequent to the cutting of the wafer 10'.

Figure 1B:

Referring now to FIG. 1B, a plurality of leads 20 which each have the above-described structural attributes are then provided in the next step of the present method. The third surface 23 of each of the leads 20 may be formed by partially etching the first surface 21. The third surface 23 of each lead 20 is preferably formed by half-etching the first surface 21 thereof to half the thickness defined between the remainder of the first surface 21 and the second surface 22. Upon the formation of the third surface 23 within each lead 20, the above-described conductive layer 24 or protective layer 24*a* may be formed on the third surface 23 through the use of the electroplating technique or electroless plating technique discussed above.

Figure 1C:
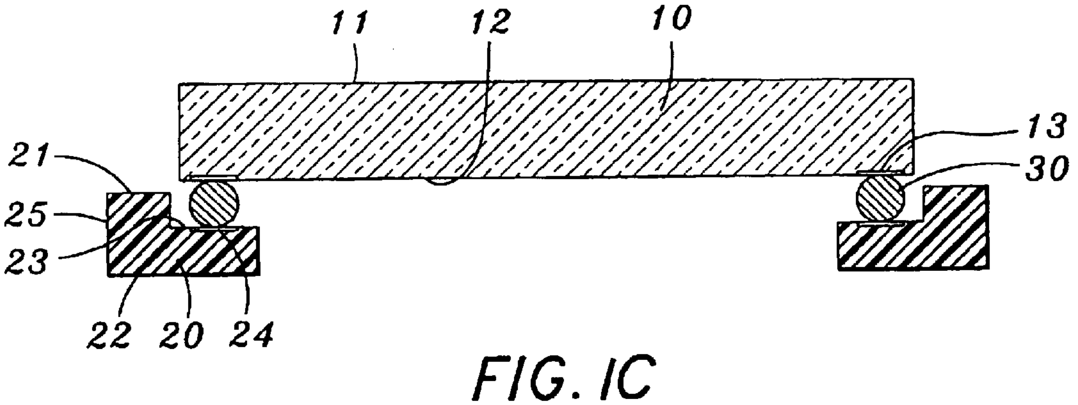

Referring now to FIG. 1C, in the next step of the present method, the bond pads 13 of the semiconductor die 10 and the third surfaces 23 of the leads 20 are electrically and mechanically connected to each other through the use of the conductive bumps 30. More particularly, the semiconductor die 10 and the leads 20 are electrically and mechanically connected to each other by reflowing the conductive bumps 30 subsequent to placing the conductive bumps 30 which have been fused to the bond pads 13 of the semiconductor die 10 into contact with the third surfaces 23 of respective ones of the leads 20, or the conductive layers 24 formed thereon. The electrical connection of the semiconductor die 10 to the recessed third surfaces 23 of the leads 20 facilitates the minimization of the entire thickness of the semiconductor package 100.

Figure 1D:
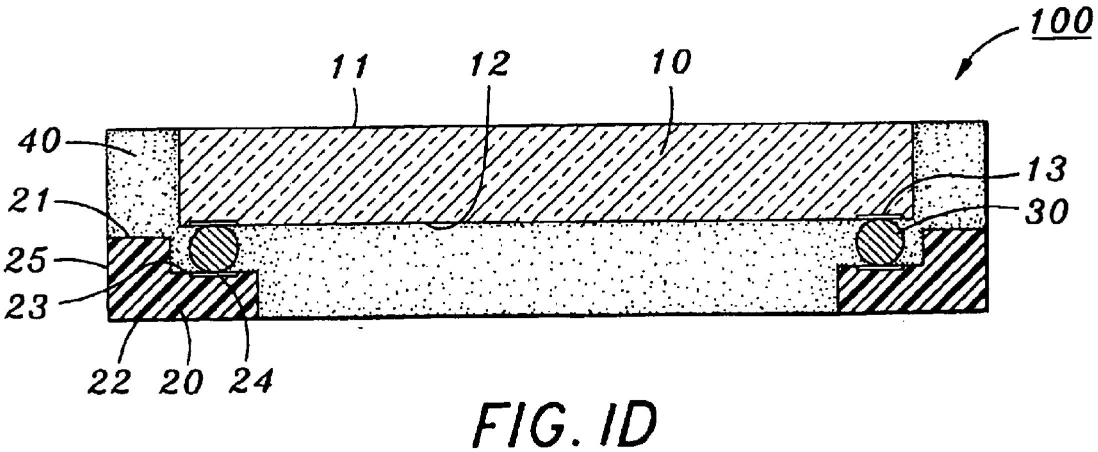

Referring now to FIG. 1D, in a final step of the present manufacturing method, the semiconductor die 10, the conductive bumps 30, and the leads 20 are partially encapsulated by an encapsulant such as an epoxy molding compound, with the hardening or curing of the encapsulant facilitating the formation of the encapsulating portion 40. As indicated above, the encapsulating portion 40 is formed such that the first surface 11 of the semiconductor die 10 is exposed within and substantially flush with the top surface of the encapsulating portion 40, with the second surfaces 22 of the leads 20 being exposed within and substantially flush with the bottom surface of the encapsulating portion 40, and the side surfaces 25 of the leads 20 being exposed within and substantially flush with the side surface of the encapsulating portion 40. The exposure of the first surface 11 of the semiconductor die 10 and side surfaces 25 of the leads 20 within the encapsulating portion 40 increases the heat discharging efficiency of the semiconductor package 100 as described above.

Figure 2:
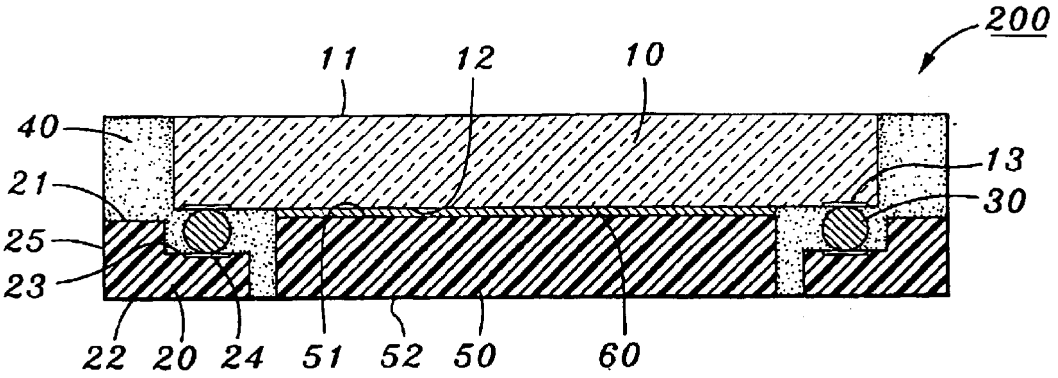
FIG. 2 is a cross-sectional view of a semiconductor package constructed in accordance with a second embodiment of the present invention.

Referring now to FIG. 2, there is shown in cross-section a semiconductor package 200 constructed in accordance with a second embodiment of the present invention. The semiconductor package 200 shown in FIG. 2 bears substantial structural similarity to the semiconductor package 100 of the first embodiment, with only the differences therebetween being described below.

As shown in FIG. 2, the semiconductor package 200 includes a die paddle 50 which is bonded to a portion of the second surface 12 of the semiconductor die 10 by a layer of die-attach material 60 therebetween. The die-attach material 60 may be any one of an epoxy, a polyimide, a double-faced adhesive tape, or its equivalent. Those of ordinary skill in the art will recognize that the present invention is not limited by any particular material for the die-attach material 60. The die paddle 50 includes a generally planar first surface 51, and a generally planar second surface 52 which is disposed in opposed relation to the first surface 51. In the semiconductor package 200, the first surface 51 of the die paddle 50 is bonded to a portion of the second surface 12 of the semiconductor die 10 through the use of the die-attach material 60. As shown in FIG. 2, the die paddle 52 does not contact any of the leads 20 which extend about and in spaced relation to the peripheral edge thereof.

As further seen in FIG. 2, the die paddle 50 is oriented within the semiconductor package 200 such that the second surface 52 thereof is substantially flush with the second surfaces 22 of the leads 20, and is thus exposed within the bottom surface of the encapsulating portion 40. As a result, the heat of the semiconductor die 10 can further be emitted or discharged to the outside of the semiconductor package 200 through the die paddle 50 in addition to the first surface 11 of the semiconductor die 10 which is itself exposed within the top surface of the encapsulating portion 40.

In the semiconductor package 200, the thickness of the die paddle 50 between the first and second surfaces 51, 52 thereof is preferably the same or similar to the thickness of each of the leads 20 between the first and second surfaces 21, 22 thereof. Such relative sizing of the die paddle 50 and leads 20 facilitates a minimization in the overall thickness of the entire semiconductor package 200. As indicated above, the first surface 11 of the semiconductor die 10 is exposed within the top surface of the encapsulating portion 40, with the second surface 52 of the die paddle 50 being exposed within the bottom surface thereof. The exposure of the first surface 11 and second surface 52 within the encapsulating portion 40 rapidly emits the heat generated from the semiconductor die 10 to the outside of the semiconductor package 200.

Referring now to FIGS. 2A–2D regarding a preferred manufacturing method for the semiconductor package 200, since such method is similar to that described above in relation to the semiconductor package 100 of the first embodiment, only the differences between these methods will be discussed below.

Figure 2A:
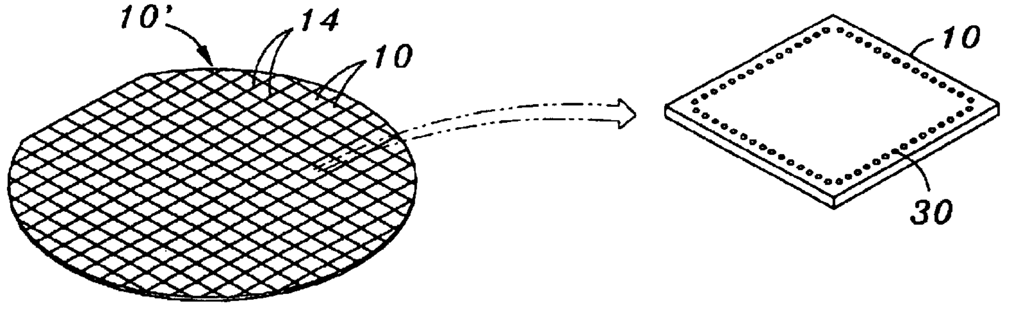
FIGS. 2A–2D are views illustrating a sequence of steps which may be employed for manufacturing the semiconductor package of the second embodiment shown in FIG. 2.
Figure 2B:
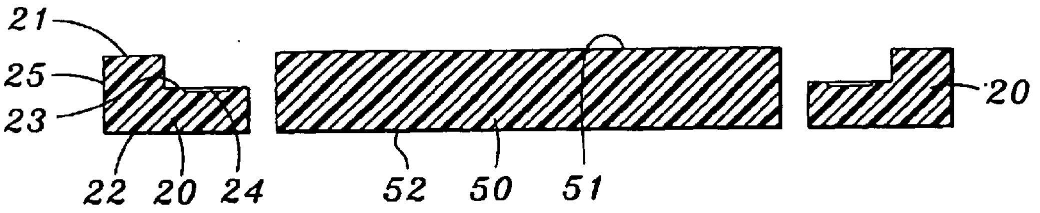

Referring now to FIG. 2A, the initial step of the manufacturing method for the semiconductor package 200 of the second embodiment is identical to that as previously described in relation to FIG. 1A above. In the next step of the manufacturing method for the semiconductor package of the second embodiment shown in FIG. 2B, the die paddle 50 and leads 20 which have the above-described configurations are provided, with the leads 20 being positioned about the peripheral edge of the die paddle 50 in spaced relation thereto. As indicated above, the thickness between the first and second surfaces 51, 52 of the die paddle 50 is preferably equal to the thickness between the first and second surfaces 21, 22 of each of the leads 20.

Figure 2C:
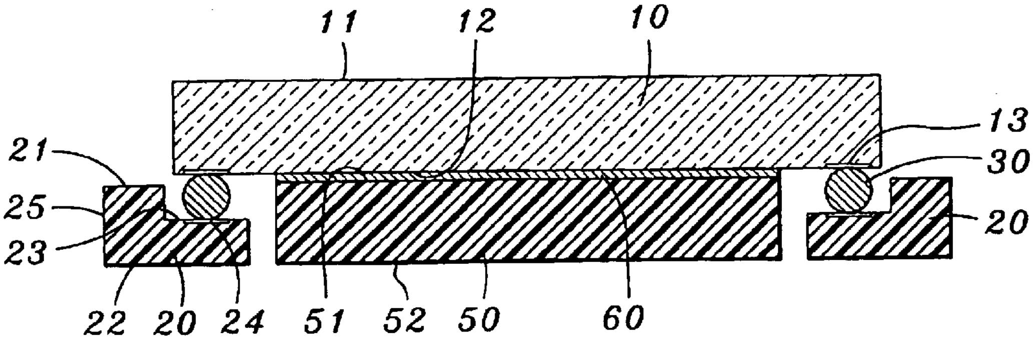
Figure 2D:
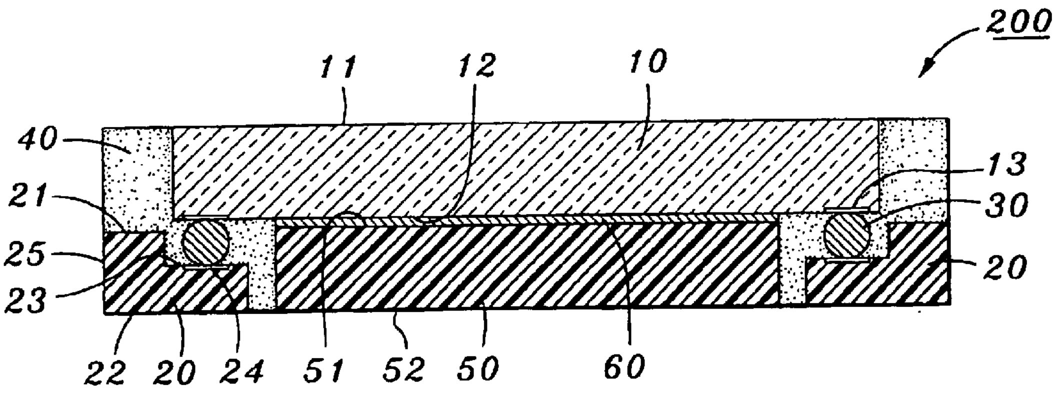

Referring now to FIG. 2C, the conductive bumps 30 fused to the bond pads 13 of the semiconductor die 10 are electrically and mechanically connected to the third surfaces 23 of respective ones of the leads 20 or the conductive layers 24 formed thereon. Additionally, the second surface 12 of the semiconductor die 10 and the first surface 51 of the die paddle 50 are bonded to each other through the use of the layer of die-attach material 60 therebetween. As such, the semiconductor die 10 is supported by the die paddle 50. Finally, as shown in FIG. 2D, the semiconductor die 10, the conductive bumps 30, the leads 20 and the die paddle 50 are partially encapsulated by an encapsulant which forms the encapsulating portion 40. In the resultant semiconductor package 200, the second surface 52 is exposed within the bottom surface of the encapsulating portion 40, and is substantially flush with the second surfaces 22 of the leads 20 as well as the bottom surface of the encapsulating portion 40.

Figure 3:
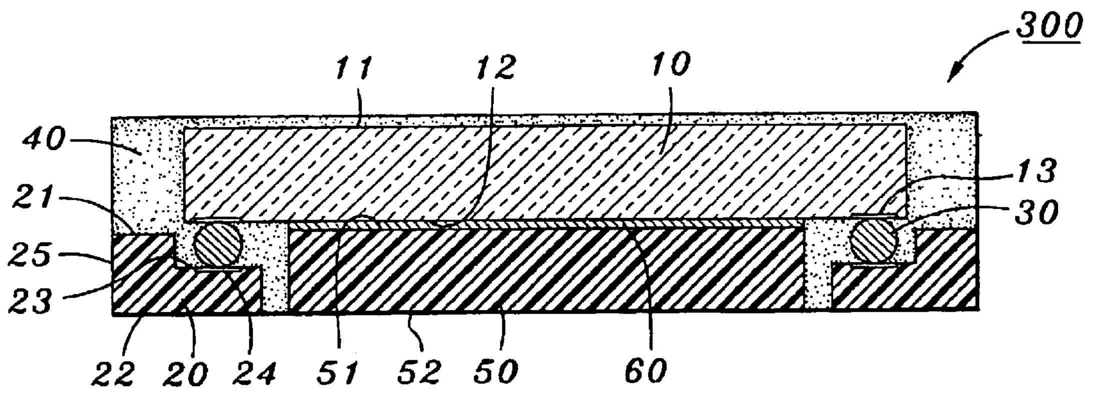
FIG. 3 is a cross-sectional view of a semiconductor package constructed in accordance with a third embodiment of the present invention.

Referring now to FIG. 3, there is shown in cross-section a semiconductor package 300 constructed in accordance with a third embodiment of the present invention. The semiconductor package 300 of the third embodiment bears substantial structural similarity to the semiconductor package 200 of the second embodiment shown in FIG. 2, with only the differences therebetween being described below.

In the semiconductor package 300 of the third embodiment, the first surface 11 of the semiconductor die 10 is encapsulated by the encapsulant (i.e., covered by the encapsulating portion 40). As a result, the first surface 11 of the semiconductor die 10 is not exposed within the encapsulating portion 40 to the outside of the semiconductor package 300. Since the semiconductor die 10 is located on the inside of the encapsulating portion 40, the bonding force between the encapsulating portion 40 and the semiconductor die 10 is increased, with the semiconductor die 10 being more positively protected from the external environment. Since the second surface 52 of the die paddle 50 is exposed within the bottom surface of the encapsulating portion 40, the heat generated by the semiconductor die 10 is still rapidly emitted to the outside of the semiconductor package 300.

Referring now to FIGS. 3A–3D regarding a preferred manufacturing method for the semiconductor package 300 of the third embodiment, since such method is similar to that employed in relation to the semiconductor package 200 as described above, only those differences between the methods will be described below.

Figure 3A:
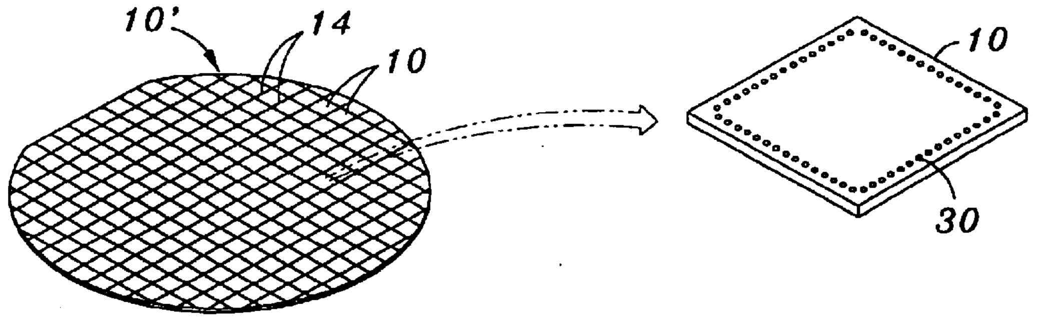
FIGS. 3A–3D are views illustrating a sequence of steps which may be employed for manufacturing the semiconductor package of the third embodiment shown in FIG. 3.
Figure 3B:
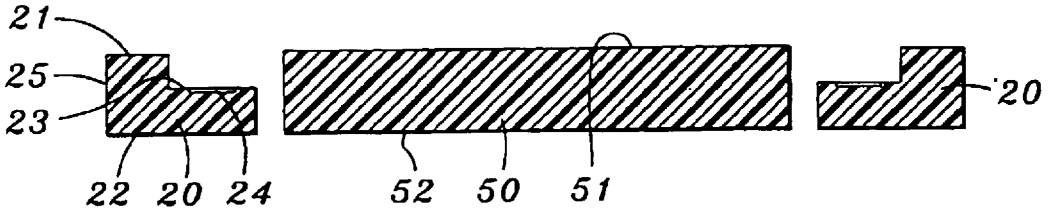
Figure 3C:
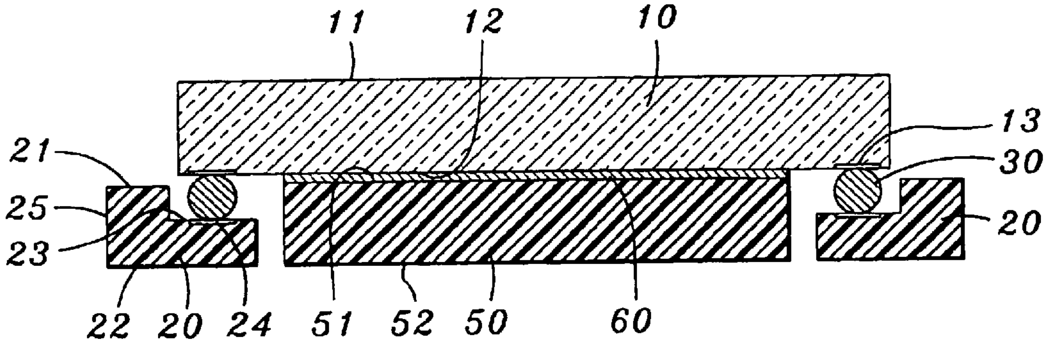
Figure 3D:
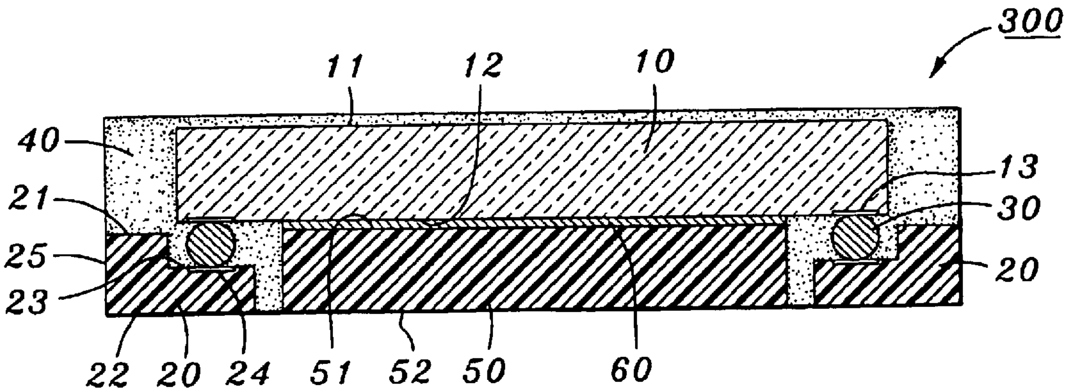

The initial steps of the manufacturing method for the semiconductor package 300 of the third embodiment as shown in FIGS. 3A, 3B, and 3C are identical to those described above in relation to FIGS. 2A, 2B, and 2C. As shown in FIG. 3D, the semiconductor die 10, the conductive bumps 30, the leads 20 and the die paddle 50 are partially encapsulated by the encapsulant used to form the encapsulating portion 40. More particularly, the first surface 11 of the semiconductor die 10 is covered by the encapsulating portion 40, and is therefore located inside the same. As a result, the semiconductor die 10 is more positively protected from the external environment. The second surface 52 of the die paddle 50 is exposed within the bottom surface of the encapsulating portion 40, and is substantially flush with the second surfaces 22 of the leads 20 as well as the bottom surface of the encapsulating portion 40. The exposure of the second surface 52 within of the encapsulating portion 40 allows the heat generated by the semiconductor die 10 to be easily emitted to the outside of the semiconductor package 300 through the die paddle 50.

Thus, according to the semiconductor packages 100, 200, 300 and related manufacturing methods of the present invention, the semiconductor die 10 and the leads 20 are electrically and mechanically connected to each other via the conductive bumps 30, with those portions of the leads 20 to which the conductive bumps 30 are connected being formed by partially etching the leads 20, thus considerably reducing the entire thickness of the semiconductor package 100, 200, 300 and resulting in a light, thin, simple, and miniature structure. Additionally, in accordance with the present invention, predetermined regions of the semiconductor die 10, leads 20, and die paddle 50 (if included) are exposed to the outside of the encapsulating portion 40, thus maximizing the heat discharging efficiency of the semiconductor package 100, 200, 300.

This disclosure provides exemplary embodiments of the present invention. The scope of the present invention is not limited by these exemplary embodiments. Numerous variations, whether explicitly provided for by the specification or implied by the specification, such as variations in structure, dimension, type of material or manufacturing process may be implemented by one of skill in the art in view of this disclosure.

What is claimed is:

1. A method for manufacturing a semiconductor package, comprising the steps of:

a) providing a semiconductor die having opposed first and second surfaces, a peripheral edge, and a plurality of bond pads disposed on the second surface in close proximity to the peripheral edge;

b) providing a plurality of homogenously formed leads which each include a first surface, a second surface disposed in opposed relation to the first surface, and a third surface disposed in opposed relation to the second surface and oriented between the first and second surfaces;

c) electrically and mechanically connecting the bond pads of the semiconductor die to the third surface of respective ones of the leads through the use of conductive bumps; and d) applying an encapsulant to the leads, the semiconductor die and the conductive bumps to form an encapsulating portion which at least partially encapsulates the leads, the semiconductor die and the conductive bumps such that the first and a portion of the third surface of each of the leads are covered by the encapsulating portion and the second surface of each of the leads is exposed therein.

2. The method of claim 1 wherein step (a) comprises:

1) providing a wafer having a plurality of semiconductor dies connected to each other via scribing lines; and 2) separating semiconductor dies from the wafer by sawing the wafer along the scribing lines.

3. The method of claim 2 wherein step (l) further comprises fusing the conductive bumps to the bond pads of each of the semiconductor dies of the wafer.

4. The method of claim 1 wherein step (a) comprises fusing the conductive bumps to respective ones of the bond pads of the semiconductor die.

5. The method of claim 1 wherein:

step (b) comprises plating a conductive layer onto the third surface of each of the leads; and step (c) comprises electrically and mechanically connecting the conductive bumps to respective ones of the conductive layers.

6. The method of claim 1 wherein step (b) comprises providing a die paddle having opposed first and second surfaces and a peripheral edge, and positioning the leads about the peripheral edge of the die paddle in spaced relation thereto.

7. The method of claim 6 wherein step (c) comprises bonding the second surface of the semiconductor die to the first surface of the die paddle.

8. The method of claim 6 wherein step (d) comprises forming the encapsulating portion such that the second surface of the die paddle is exposed therein.

9. The method of claim 8 wherein step (d) comprises forming the encapsulating portion such that the first surface of the semiconductor die is exposed therein.

10. The method of claim 1 wherein step (d) comprises forming the encapsulating portion such that the first surface of the semiconductor die is exposed therein.

11. A method for fabricating a semiconductor package, comprising the steps of:

a) providing a semiconductor die having opposed first and second surfaces and a plurality of bond pads on the second surface;

b) providing a plurality of homogenously formed leads which each include a first surface, a second surface disposed in opposed relation to the first surface, and a third surface disposed in opposed relation to the second surface and oriented between the first and second surfaces;

c) forming a protective layer on a portion of the third surface of each of the leads such that the protective layer circumvents a portion of the third surface which defines a bump land;

d) electrically connecting the bond pads of the semiconductor die to the bump lands of respective ones of the leads through the use of conductive bumps; and e) applying an encapsulant to the leads, the semiconductor die and the conductive bumps to form an encapsulating portion which at least partially encapsulates the leads, the semiconductor die and the conductive bumps such that the first and a portion of the third surface of each of the leads are covered by the encapsulating portion and the second surface of each of the leads is exposed therein.

12. The method of claim 11 wherein step (c) comprises forming the protective layer through an electroplating technique.

13. The method of claim 11 wherein step (c) comprises forming the protective layer through an electroless plating technique.

14. The method of claim 11 wherein step (b) comprises providing a die paddle having opposed first and second surfaces and a peripheral edge, and positioning the leads about the peripheral edge of the die paddle in spaced relation thereto.

15. The method of claim 14 wherein step (d) comprises bonding the second surface of the semiconductor die to the first surface of the die paddle.

16. The method of claim 15 wherein step (e) comprises forming the encapsulating portion such that the second surface of the die paddle is exposed therein.

17. The method of claim 16 wherein step (e) comprises forming the encapsulating portion such that the first surface of the semiconductor die is exposed therein.

18. The method of claim 11 wherein step (e) comprises forming the encapsulating portion such that the first surface of the semiconductor die is exposed therein.

19. The method of claim 11 wherein step (e) comprises forming the encapsulating portion such that at least a portion of each of the leads is exposed therein.

20. A method for manufacturing a semiconductor package, the method comprising the steps of:

a) providing a semiconductor die having opposed first and second surfaces and a plurality of bond pads disposed on the second surface;

b) providing a plurality of homogenously formed leads which each include a first surface, a second surface disposed in opposed relation to the first surface, and a third surface disposed in opposed relation to the second surface and oriented between the first and second surfaces;

c) electrically connecting the bond pads of the semiconductor die to the third surface of respective ones of the leads; and d) applying an encapsulant to the leads, the semiconductor die and the conductive bumps to form an encapsulating portion which at least partially encapsulates the leads and the semiconductor die such that the first and a portions of the third surface of each of the leads are covered by the encapsulating portion and the second surface of each of the leads is exposed therein.

* * * * *